(12) United States Patent  
Su et al.

(10) Patent No.: US 8,598,788 B2  
(45) Date of Patent: Dec. 3, 2013

(54) SYSTEM FOR DISPLAYING IMAGES

(75) Inventors: Po-Kun Su, Sijhih (TW); Jui-Hsiang Yen, Miaoli County (TW); Ryuji Nishikawa, Hsinchu (TW)

(73) Assignee: Chimei Innolux Corporation (TW)

( * ) Notice: Subject to any disclaimer, the term of this patent is extended or adjusted under 35 U.S.C. 154(b) by 602 days.

(21) Appl. No.: 12/548,517

(22) Filed: Aug. 27, 2009

(65) Prior Publication Data

US 2010/0059780 A1 Mar. 11, 2010

Related U.S. Application Data

(60) Provisional application No. 61/205,141, filed on Jan. 14, 2009, provisional application No. 61/095,861, filed on Sep. 10, 2008.

(30) Foreign Application Priority Data

Jun. 29, 2009 (TW) .............................. 98121782 A

(51) Int. Cl.  
*H01J 1/62* (2006.01)  
*H01J 63/04* (2006.01)

(52) U.S. Cl.  
USPC .............................. 313/507; 313/509; 257/98

(58) Field of Classification Search  
USPC .................................... 257/98; 313/507, 509  
See application file for complete search history.

(56) References Cited

U.S. PATENT DOCUMENTS

| | | | | |
|---|---|---|---|---|
| 5,589,733 | A * | 12/1996 | Noda et al. | 313/509 |
| 5,780,174 | A * | 7/1998 | Tokito et al. | 428/690 |
| 5,858,561 | A * | 1/1999 | Epstein et al. | 428/690 |
| 6,406,801 | B1 * | 6/2002 | Tokito et al. | 428/690 |
| 2004/0046499 | A1 * | 3/2004 | Park et al. | 313/509 |
| 2005/0110400 | A1 * | 5/2005 | Nakamura | 313/506 |
| 2005/0194896 | A1 * | 9/2005 | Sugita et al. | 313/506 |
| 2005/0263775 | A1 * | 12/2005 | Ikeda et al. | 257/79 |
| 2006/0102912 | A1 | 5/2006 | Abe et al. | |
| 2007/0222378 | A1 * | 9/2007 | Nakamura | 313/507 |
| 2008/0129191 | A1 * | 6/2008 | Lee et al. | 313/504 |

FOREIGN PATENT DOCUMENTS

CN 1700826 11/2005

OTHER PUBLICATIONS

Office Action dated Nov. 20, 2013 from corresponding application No. CN200910162728.3.  
Office Action dated May 25, 2012 from corresponding application No. CN200910162728.3.

\* cited by examiner

*Primary Examiner* — Jae Lee  
*Assistant Examiner* — Grant Withers  
(74) *Attorney, Agent, or Firm* — Lowe Hauptman & Ham, LLP

(57) ABSTRACT

A system for displaying images employing an organic electroluminescent device is provided. The organic electroluminescent device includes a first electrode, an organic electroluminescent element disposed on the first electrode, a second electrode disposed on the organic electroluminescent element, and a color tuning element disposed on the second electrode. In particular, the color tuning element has a thickness range T1: 3500 Å≤T1≤4500 Å, 6500 Å≤T1≤7500 Å, 9500 Å≤T1≤10500 Å, 11000 Å≤T1≤12000 Å, 13500 Å≤T1≤14500 Å, 16500 Å≤T1≤17500 Å, or 18500 Å≤T1≤19500 Å.

20 Claims, 13 Drawing Sheets

SYSTEM FOR DISPLAYING IMAGES

CROSS REFERENCE TO RELATED APPLICATIONS

The present application claims priority from Provisional U.S. Patent Application Ser. No. 61/205,141, filed on Jan. 14, 2009 and incorporated herein by reference; The present application also claims priority from Provisional U.S. Patent Application Ser. No. 61/095,861, filed on Sep. 10, 2008 and incorporated herein by reference; This application is also based upon and claims the benefit of priority from the prior Taiwan Patent Application No. 98121782, filed on Jun. 29, 2009, the entire contents of which are incorporated herein by reference.

BACKGROUND

1. Technical Field

The invention relates to a system for displaying images, and more particularly to a system for displaying images comprising an organic electroluminescent device.

2. Description of the Related Art

Recently, organic electroluminescent devices are widely applied in various display devices because they have a wider viewing angle, faster response, and a simple fabrication process. However, there is still room for improvement in terms of luminescence efficiency of the organic electroluminescent devices. Further, organic electroluminescent devices suffer from low reliability due to moisture seeping therein.

FIG. 1 shows a cross-section of an organic electroluminescent device disclosed in U.S. Pub. No. 20080129191A1, wherein the organic electroluminescent device is a bottom-emission organic electroluminescent device 100 comprising a substrate 102, a transparent electrode 106, a hole injection layer 108, a hole transport layer 110, a blue emitting layer 112, a green emitting layer 114, a red emitting layer 116, an electron transport layer 118, an electron injection layer 120, and a reflection electrode 122. The bottom-emission organic electroluminescent device 100 further comprises an optical path control layer 104 disposed between the substrate 102 and the transparent electrode 106. U.S. Pub. No. 20080129191A1 teaches that the optical path control layer 104 has a thickness of 660 nm and 750 nm, the optical path control layer 104 is disposed on the substrate 102, and the organic electroluminescent layers (including a transparent electrode 106, a hole injection layer 108, a hole transport layer 110, a blue emitting layer 112, a green emitting layer 114, a red emitting layer 116, an electron transport layer 118, and an electron injection layer 120) are disposed outside of the optical path control layer 104. Therefore, the optical path control layer 104 does not protect the bottom-emission organic electroluminescent device and does not prevent the bottom-emission organic electroluminescent device from moisture, infiltrating therein. Additionally, the problem of relieving residual stress resulting from the optical path control layer 104 is not taught.

Thus, in order to solve the aforementioned problems, a novel organic electroluminescent device is called for.

BRIEF SUMMARY

An exemplary embodiment of the invention provides a system for displaying images. The system comprises an organic electroluminescent device comprising a first electrode, an organic electroluminescent element disposed on the first electrode, a second electrode disposed on the organic electroluminescent element, and a color tuning element disposed on the second electrode. In particular, the color tuning element has a thickness range T1: 3500 Å≤T1≤4500 Å, 6500 Å≤T1≤7500 Å, 9500 Å≤T1≤10500 Å, 11000 Å≤T1≤12000 Å, 13500 Å≤T1≤14500 Å, 16500 Å≤T1≤17500 Å, or 18500 Å≤T1≤19500 Å.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
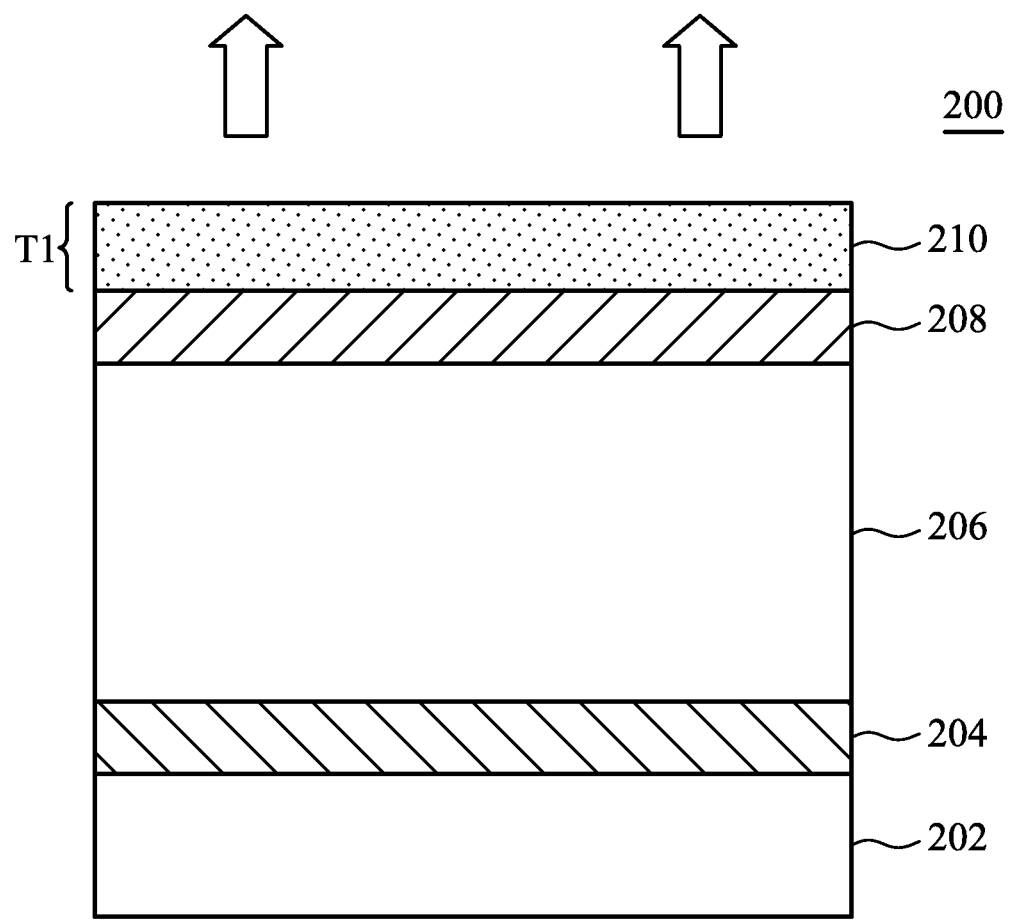
FIG. 2 is a cross-section of an organic electroluminescent device according to an embodiment of the invention.

Referring to FIG. 2, an organic electroluminescent device 200 employed by a system for displaying images according to an embodiment of the invention is provided. Herein, the organic electroluminescent device 200 can be a top-emission full-color organic electroluminescent device and comprise a substrate 202 and a light emitting diode (subsequently comprising a first electrode 204, an organic electroluminescent element 206, a second electrode 208, and a color tuning element 210) formed on the substrate 202.

Figure 3:
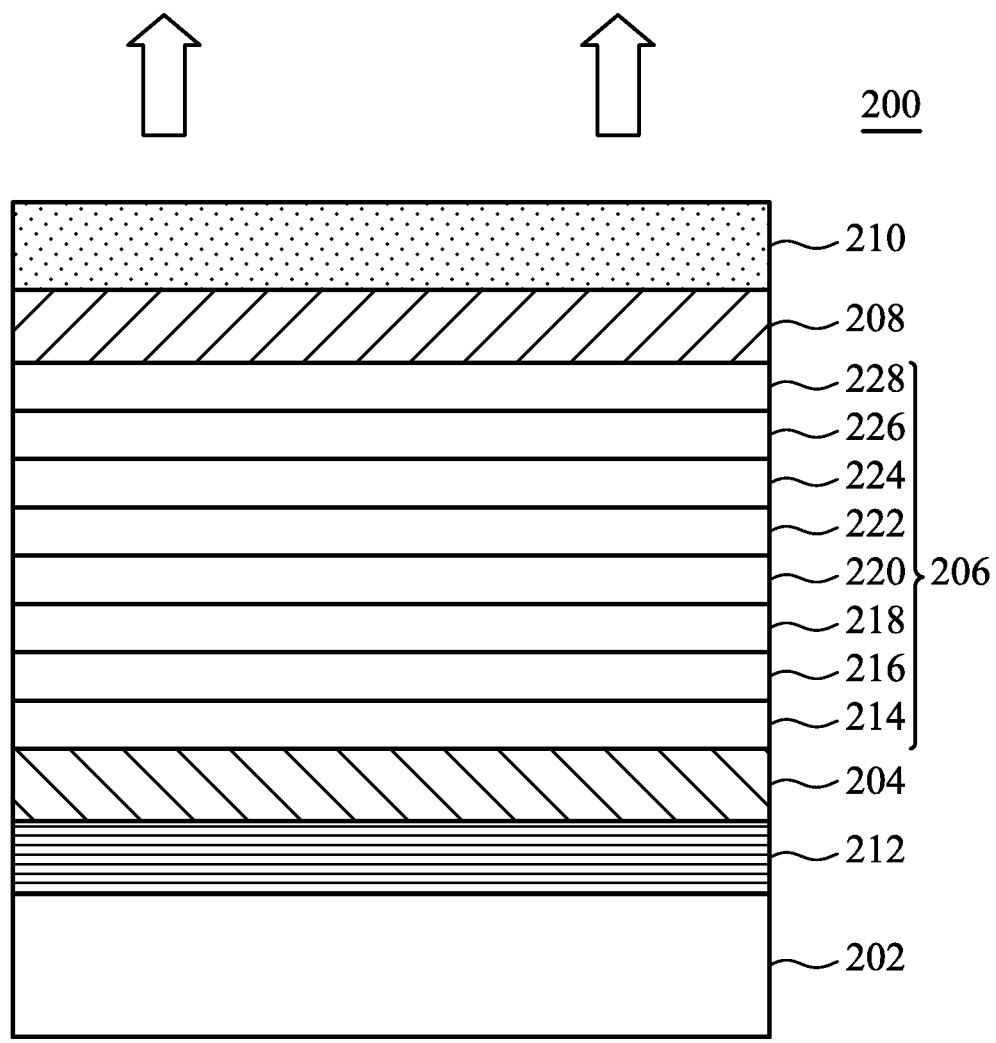
FIG. 3 is a cross-section of an organic electroluminescent device according to another embodiment of the invention.

The substrate 202 can be a glass substrate, a plastic substrate, or a semiconductor substrate. The substrate 202 can be a substrate comprising a required element (such as a thin film transistor). The accompanying drawings illustrate the substrate 202 as a plain rectangle in order to simplify the illustration. The first electrode 204 can be a reflection electrode, reflecting the scattering lights toward the substrate 202 for total reflection. The reflective electrode can comprise Ag, Al, Au, or combinations thereof. Further, according to another embodiment of the invention, referring to FIG. 3, the first electrode 204 can be a transparent electrode, and the organic electroluminescent device 200 can further comprise a reflection layer 212 formed between the substrate 202 and the first electrode 204, thereby reflecting the scattering lights toward the substrate 202 for total reflection. The transparent electrode can comprise indium tin oxide, indium zinc oxide, aluminum zinc oxide, zincoxide, or combinations thereof. The organic electroluminescent element 206 at least comprises a light emitting layer. Referring to FIG. 3, the organic electroluminescent element 206 comprises a hole injection layer 214, a hole transport layer 216, a red emitting layer 218, a block layer 220, a blue emitting layer 222, a green emitting layer 224, an electron transport layer 226, and an electron injection layer 228, from the first electrode 204 side to the second electrode 208 side. The thickness of the organic electroluminescent element 206 can be between 800-1000 Å. The layers, materials and the thickness of the organic electroluminescent element 206 are not limited and can be optionally modified by a person of ordinary skill in the field. The second electrode 208 is a transparent electrode. Suitable materials of the transparent electrode can be transparent metal or metallic oxide, such as indium tin oxide, indium zinc oxide, aluminum zinc oxide, or zincoxide.

Figure 4:
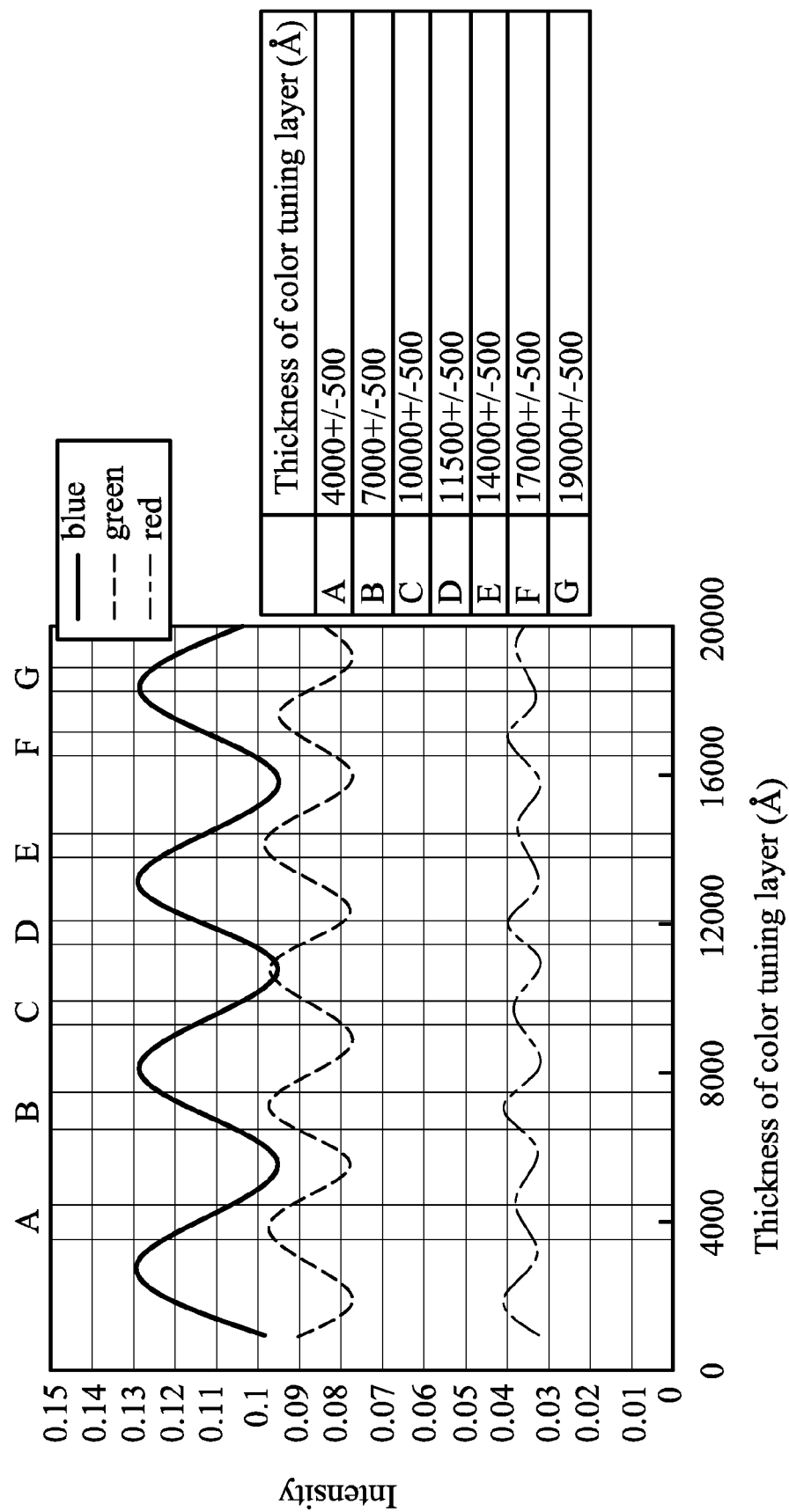
FIG. 4 shows a graph plotting RGB peak intensity against thickness of the color tuning element as disclosed in an organic electroluminescent device according to an embodiment of the invention.

According to the organic electroluminescent device 200 of the invention, the color tuning element 210 formed on the second electrode 208 enhances the peak intensity of the red, green, and blue emission respectively. Referring to FIG. 4, when the color tuning element 210 has the thickness T1 corresponding to the following equations: 3500 Å≤T1≤4500 Å, 6500 Å≤T1≤7500 Å, 9500 Å≤T1≤10500 Å, 11000 Å≤T1≤12000 Å, 13500 Å≤T1≤14500 Å, 16500 Å≤T1≤17500 Å, or 18500 Å≤T1≤19500 Å, the organic electroluminescent device exhibits blue, red, and green emissions with relatively high peak intensity at the same time. Therefore, the observed white emission mixed by the blue, red, and green emissions exhibits high luminescence efficiency.

Figure 1:
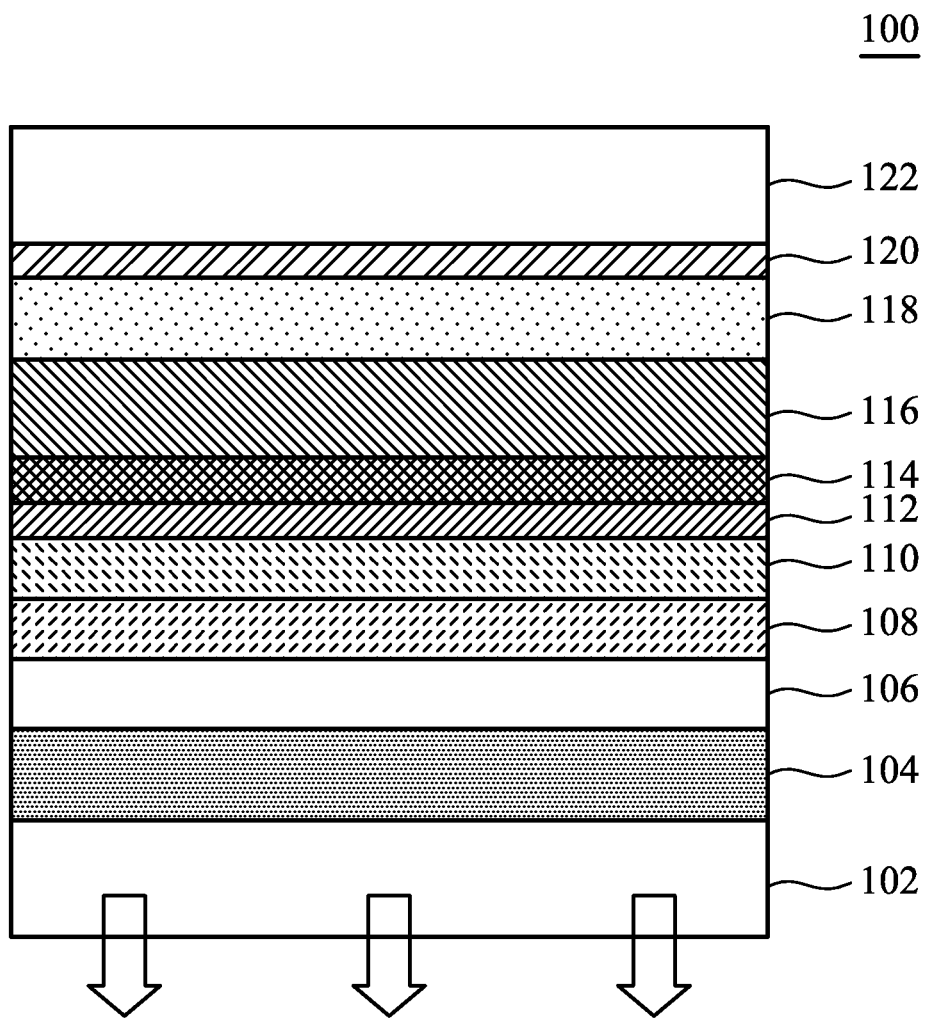
FIG. 1 is a cross-section of a conventional organic electroluminescent device.

Accordingly, in the invention, the chromaticity coordinates of the organic electroluminescent device can be adjusted by modifying the thickness of the color tuning element 210. Further, the color tuning element 210 can be made of a silicon-containing material with a refractive index of between 1.4-2.2, such as silicon oxide, silicon nitride, silicon oxynitride, or combinations thereof. Since the color tuning element 210 is formed on the organic electroluminescent element 206 rather than below the organic electroluminescent element 206 as disclosed in the prior art (shown in FIG. 1), the color tuning element 210 can simultaneously serve as a protective layer of the organic electroluminescent device 200, improving the protective ability for the organic electroluminescent device and preventing the organic electroluminescent device from moisture infiltration. Moreover, the thickness of the color tuning element 210 is thick enough to enhance the protective ability and moisture resistance.

Figure 5:
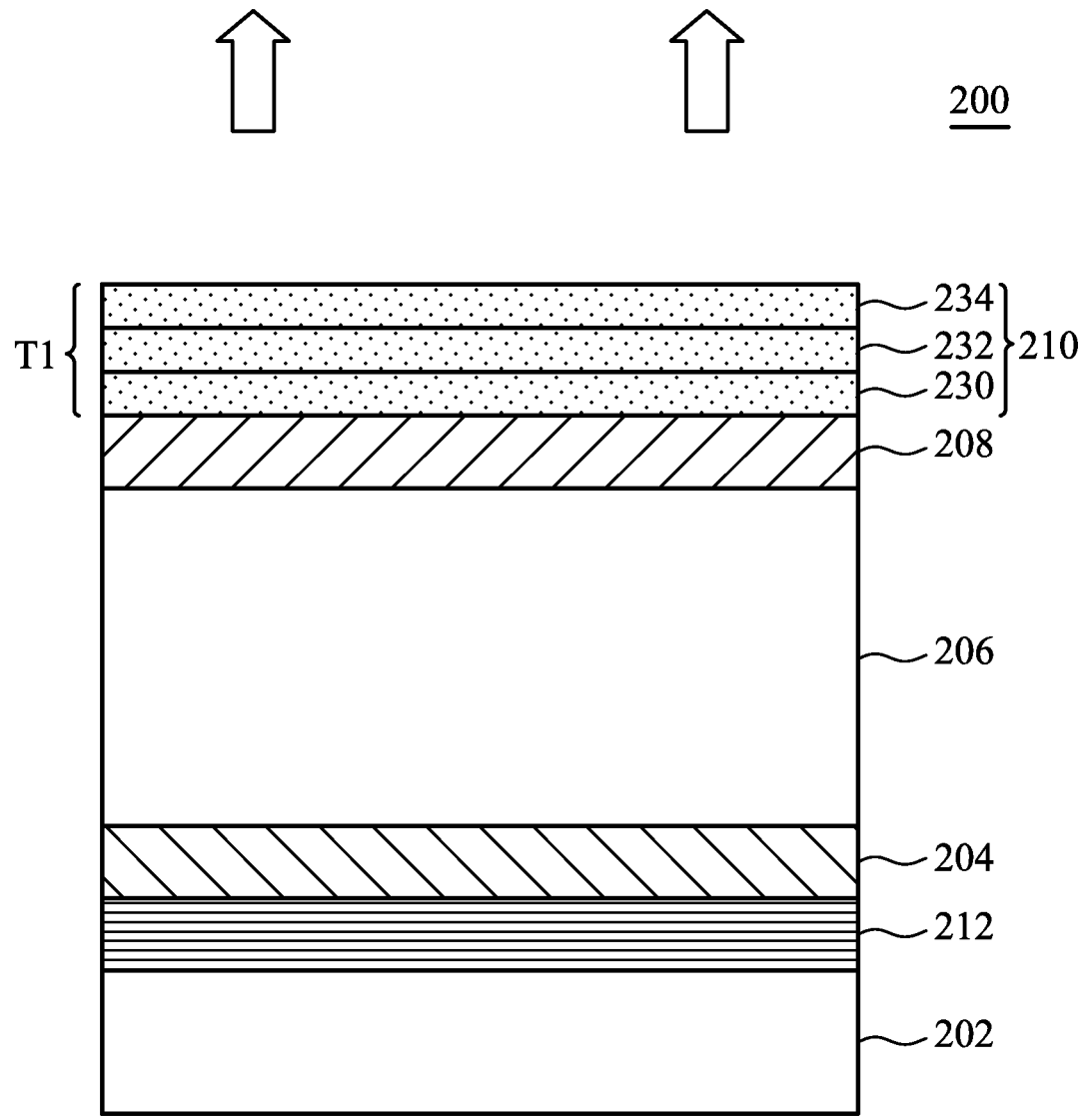
FIG. 5 is a cross-section of an organic electroluminescent device according to yet another embodiment of the invention.

According to an embodiment of the invention, referring to FIG. 5, the color tuning element 210 comprises color tuning layers 230, 232, and 234. The color tuning layer 230 can be disposed on the second electrode 208, wherein the color tuning layer 230 can be made of a material with a refractive index of between 1.4-1.6, such as silicon oxide. The color tuning layer 230 can have a thickness of less than 1000 Å, such as 50 Å. The color tuning layer 232 can be disposed on the color tuning layer 230, and the color tuning layer 232 can be made of a material with a refractive index of between 1.6-2.2, such as silicon nitride. The color tuning layer 234 can be disposed on the color tuning layer 232, and the color tuning layer 234 can be made of a material with a refractive index of between 1.5-2.0, such as silicon oxynitride. The color tuning layer 234 has a thickness of between 500-1500 Å, such as 1000 Å. It should be noted that the total thickness of the color tuning layers 230, 232, and 234 can be the thickness T1. In some embodiments of the invention, the color tuning layers 232 can have a thickness corresponding to the definition of the thickness T1, and the total thickness of the color tuning layers 230, 232, and 234 can be more than the thickness T1.

Figure 6:
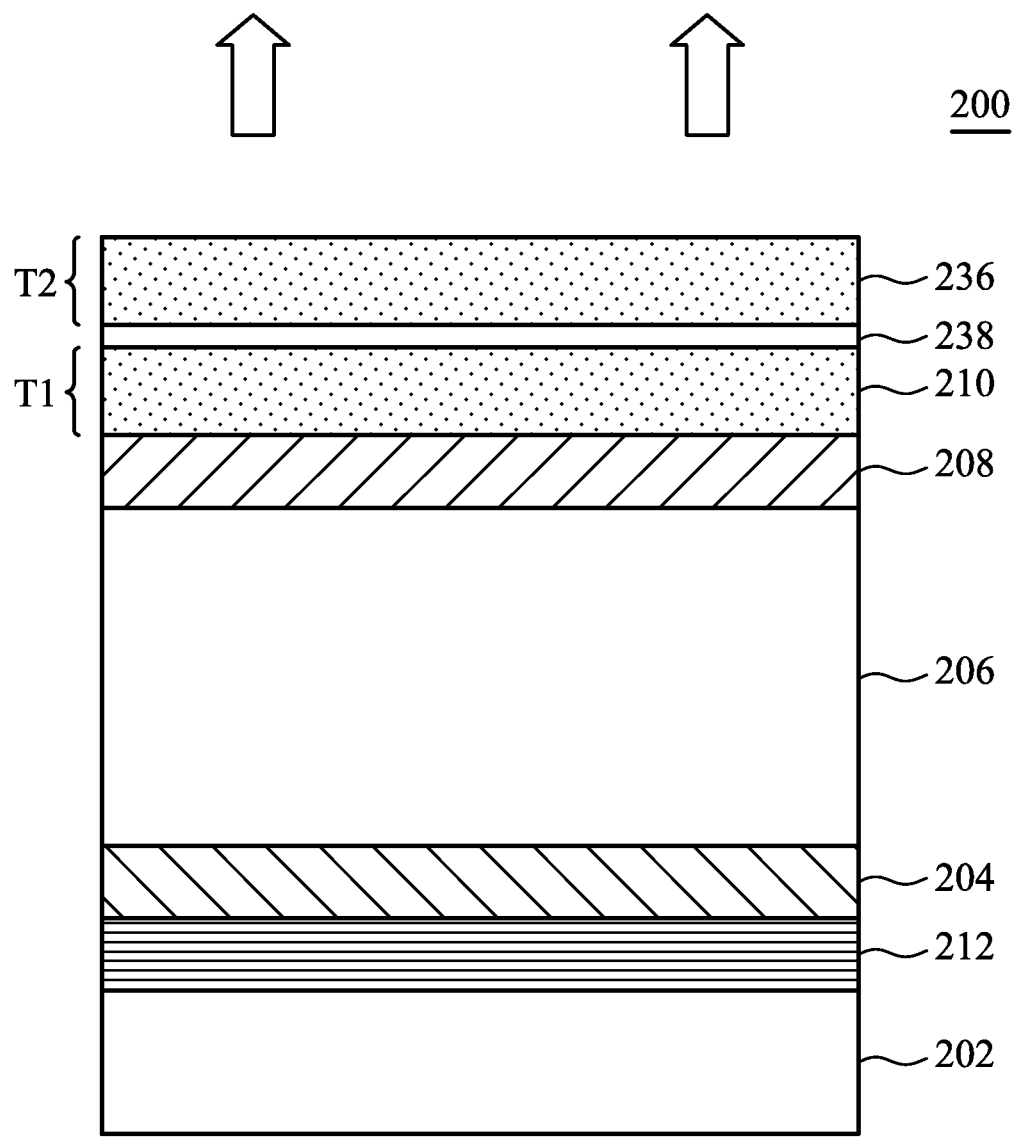
FIG. 6 is a cross-section of an organic electroluminescent device according to still another embodiment of the invention.

According to an embodiment of the invention, referring to FIG. 6, the organic electroluminescent device 200 can comprises two color tuning elements 210 and 236, and a stress relief layer 238 is used to separate the two color tuning elements 210 and 236 from each other. The color tuning elements 210 and 236 can be made of a material with a refractive index of between 1.4-2.2, such as silicon oxide, silicon nitride, silicon oxynitride, or combinations thereof. The thickness of the color tuning element 210 is defined as above. The color tuning element 236 has a thickness T2 corresponding to the following equations: 3500 Å≤T2≤4500 Å, 6500 Å≤T2≤7500 Å, 9500 Å≤T2≤10500 Å, 11000 Å≤T2≤12000 Å, 13500 Å≤T2≤14500 Å, 16500 Å≤T2≤17500 Å, or 18500 Å≤T2≤19500 Å. The stress relief layer 238 is used to relieve any residual stress resulting from the thicker color tuning element. The stress relief layer 238 can exhibit a refractive index of between 1.4-2.2. Suitable materials of the stress relief layer 238 can be indium tin oxide, indium zinc oxide, aluminum zinc oxide, zincoxide, aluminium oxide, or combinations thereof.

Further, the stress relief layer 238 can have a thickness of between 500-2000 Å, such as 1000 Å. In an embodiment of the invention, the refractive index difference between any two of the color tuning element 210, the stress relief layer 238, and the color tuning element 236 is not more than 1, in order to enhance the light extraction of the organic electroluminescent element 206. Further, the method for fabricating the color tuning elements 210 and 236 is different than that of the stress relief layer 238, thereby benefiting stress relief effects. For example, if the method for fabricating the color tuning elements 210 and 236 is sputtering, the method for fabricating the stress relief layer 238 can be chemical vapor deposition rather than sputtering. To the contrary, if the method for fabricating the color tuning elements 210 and 236 is chemical vapor deposition, the method for fabricating the stress relief layer 238 can be sputtering rather than chemical vapor deposition. Accordingly, the stress relationship of the color tuning element 210, the stress relief layer 238, and the color tuning element 236 can be represented in sequence as compressive/tensile/compressive or tensile/compressive/tensile. Particularly, the compressive or tensile stress is decided by fabrication methods.

Figure 7:
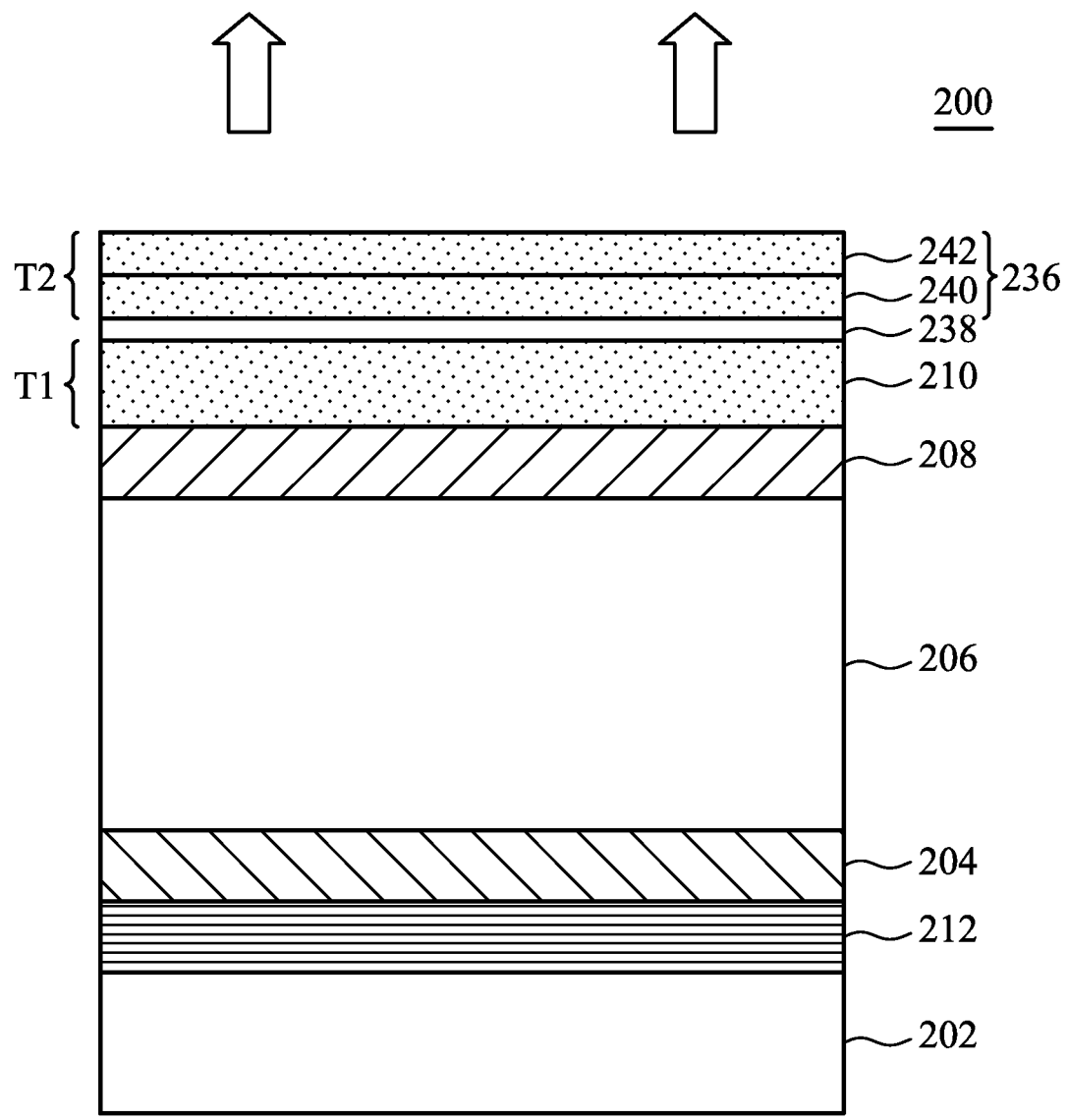
FIG. 7 is a cross-section of an organic electroluminescent device according to still another embodiment of the invention.

According to another embodiment of the invention, referring to FIG. 7, the organic electroluminescent device 200 comprises color tuning elements 210 and 236 separated by the stress relief layer 238. In particular, the color tuning element 236 comprises color tuning layers 240 and 242. The color tuning layers 240 is made of a material with a refractive index of between 1.4-2.2, such as silicon oxide, silicon nitride, silicon oxynitride, or combinations thereof. The color tuning layer 242 is formed on the color tuning layer 240, and the color tuning layer 242 can be made of a material with a refractive index of between 1.4-1.6, such as silicon oxide, or be made of a material with a refractive index of between 1.5-2.0, such as silicon oxynitride. Further, the color tuning layer 242 can be formed below the color tuning layer 240. For example, the color tuning element 236 can have a thickness of 10000 Å, wherein the color tuning layer 242 can have a thickness of 1000 Å.

Herein, the material and the thickness of the color tuning layer 242 can be the same as those of the color tuning layer 232 shown in FIG. 5, and the material and the thickness of the color tuning layer 240 can be the same as those of the color tuning layer 230 shown in FIG. 5.

Figure 8:
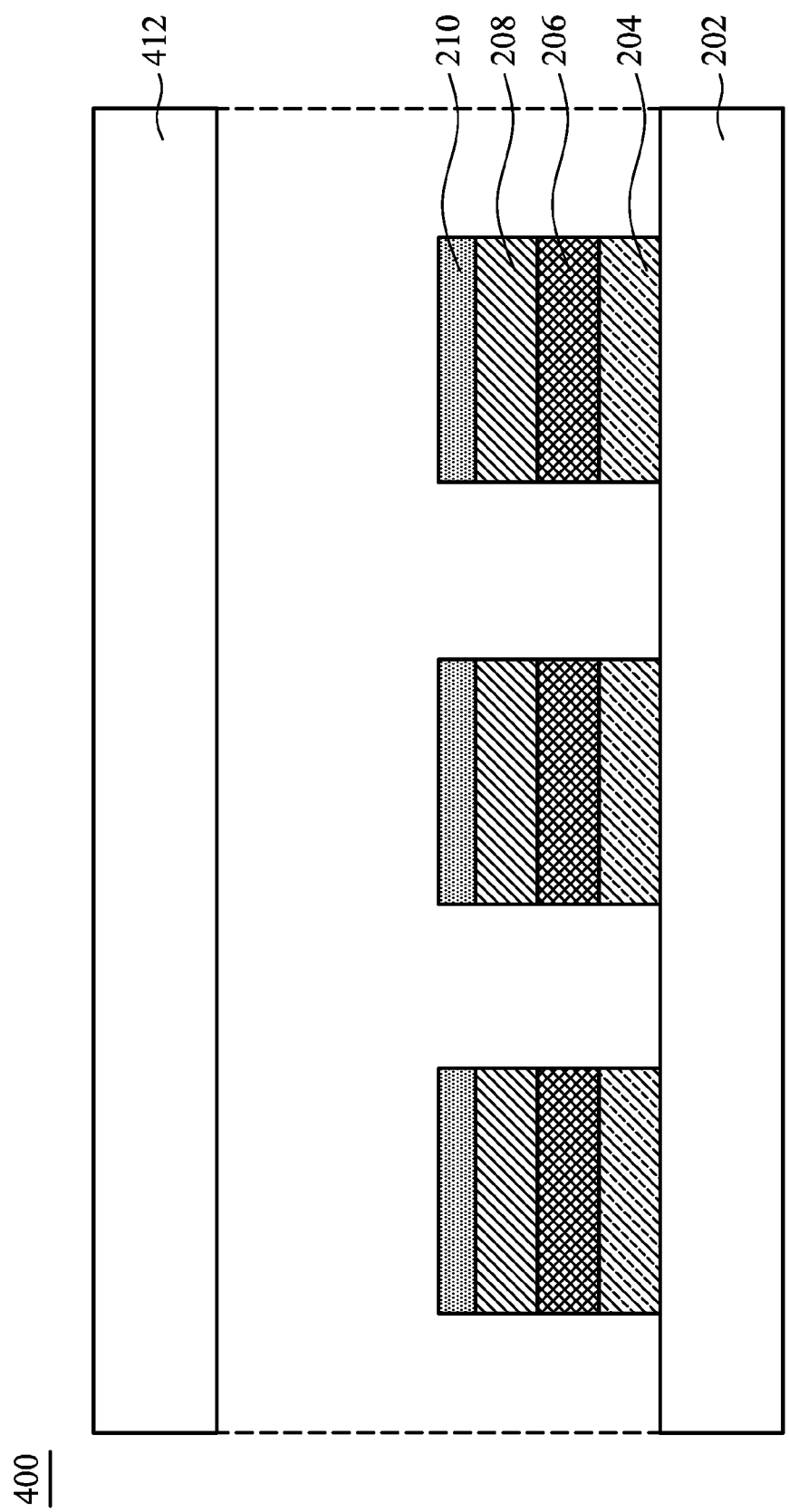
FIG. 8 is a cross-section of an organic electroluminescent device with a color filter substrate according to still another embodiment of the invention.

FIG. 8 shows a cross-section of an organic electroluminescent device 400 according to another embodiment of the invention. The organic electroluminescent device 400 comprises an array comprising a plurality of light emitting diodes (as shown in FIG. 2). The light emitting diodes are disposed on the substrate 202 and between the substrates 202 and 412. Each light emitting diode comprises a first electrode 204, an organic electroluminescent element 206, a second electrode 208, and a color tuning element 210. Herein, each color tuning element 210 is formed on the corresponding second electrode 208 in advance, and the color tuning elements 210 are discontinuous. Further, referring to FIG. 9, the color filter substrate 412 comprises a red pixel 414, a green pixel 416, and a blue pixel 418 formed on the substrate 412, in another embodiment of the invention. The two adjacent pixels are separated by a black matrix 420. The light emitting diodes (comprising the first electrode 204, the organic electroluminescent element 206 and the second electrode 208) are respectively corresponding to the red pixel 414, the green pixel 416, and the blue pixel 418. Herein, the color tuning element 210 is formed on each second electrode 208 of the light emitting diodes after the light emitting diodes are disposed on the substrate 202. Therefore, the color tuning element 210 is a continuous film and covers the side-walls of the light emitting diodes, thereby protecting the light emitting diodes and preventing the light emitting diodes from moisture infiltration. Parts of the color tuning element 210 corresponding to the red pixel 414, the green pixel 416, and the blue pixel 418 have the same thickness. Namely, the color tuning element 210 has a single thickness.

Figure 9:
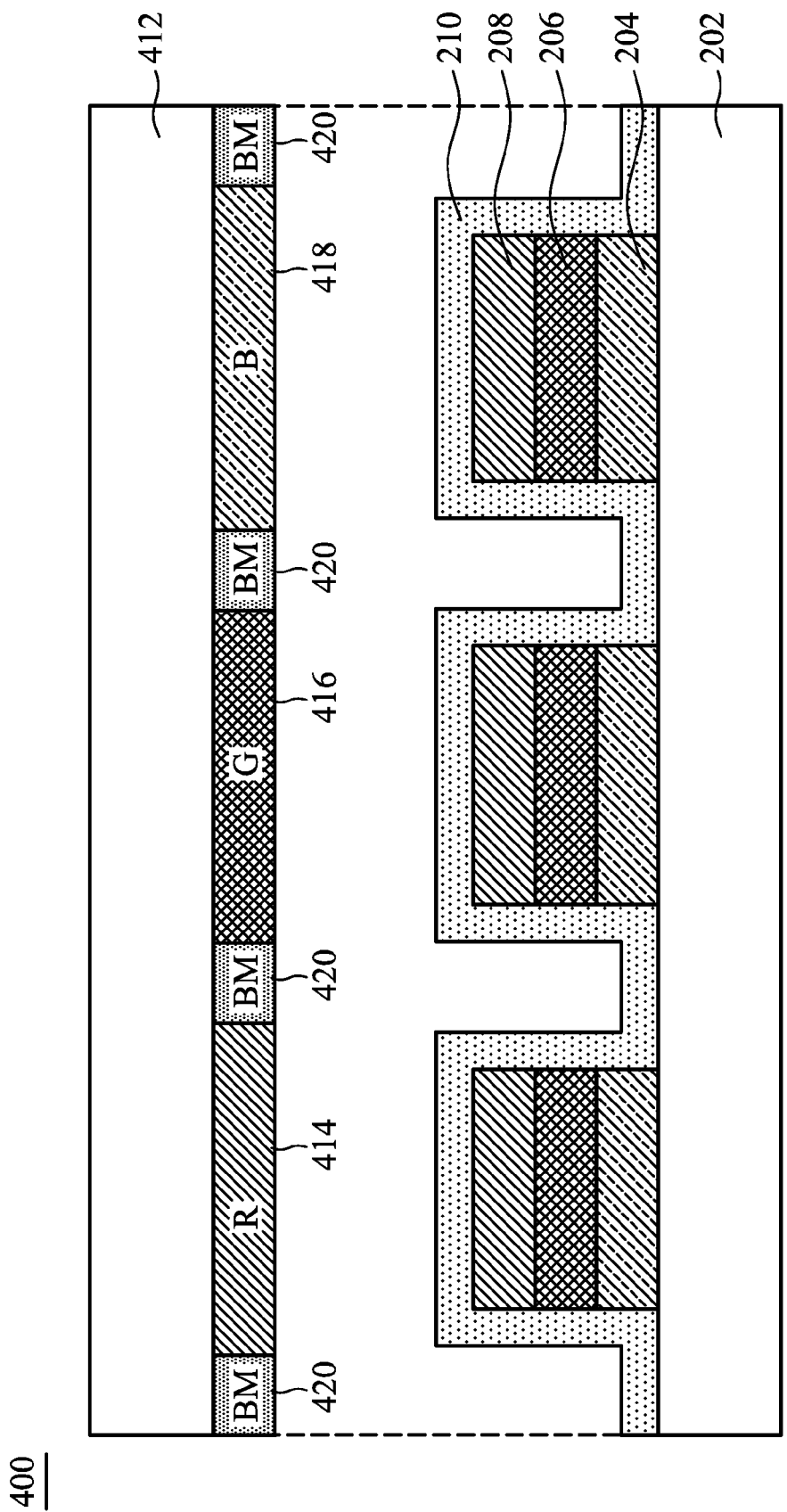
FIG. 9 is a cross-section of an organic electroluminescent device with a color filter substrate according to still another embodiment of the invention.
Figure 10:
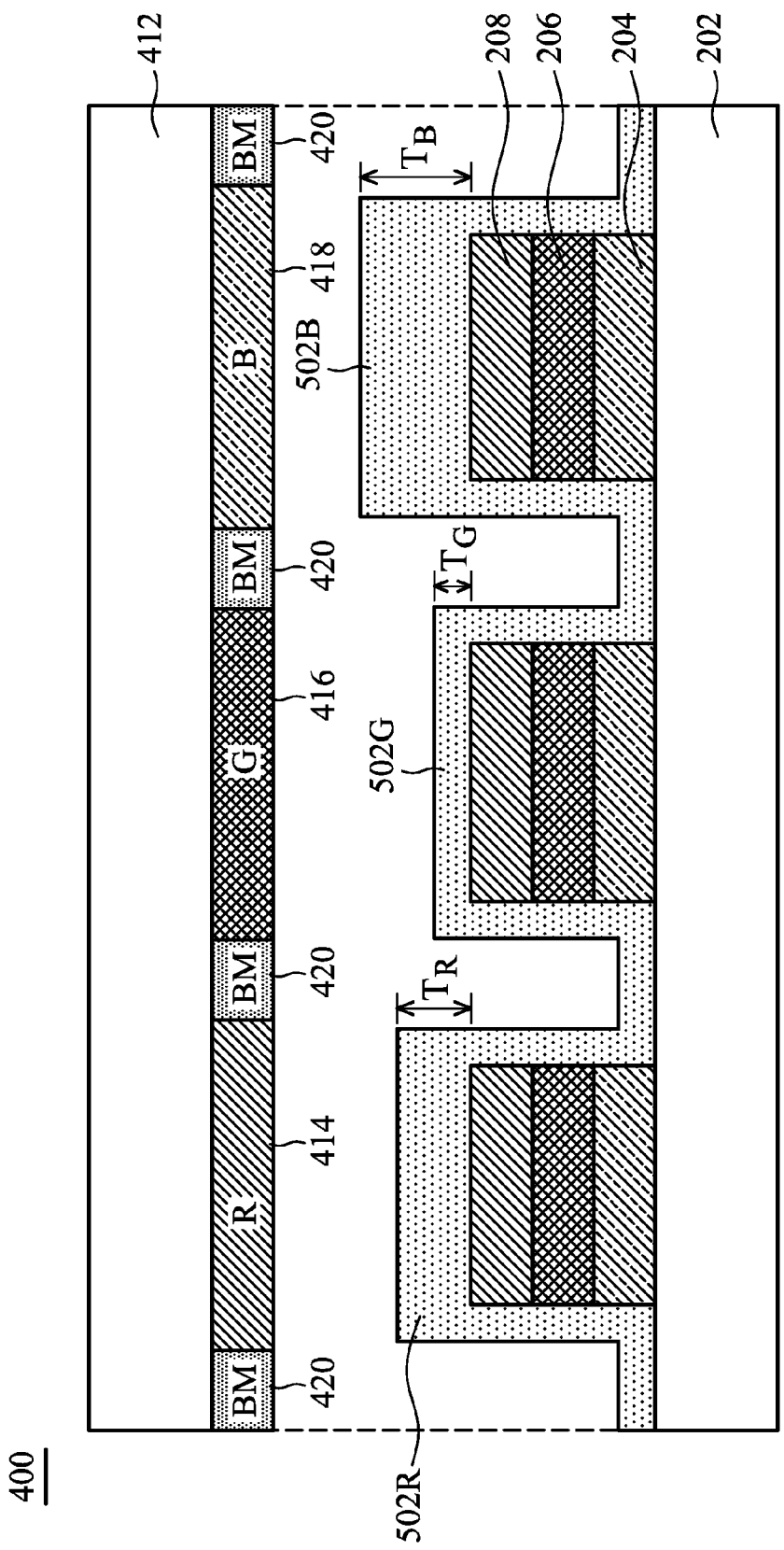
FIG. 10 is a cross-section of an organic electroluminescent device with a color filter substrate according to still another embodiment of the invention.

FIG. 10 shows a cross-section of an organic electroluminescent device 400 according to another embodiment of the invention. The elements shown in FIG. 10 which are the same as those shown in FIG. 9 are indicated by the same references. In comparison with FIG. 9, the color tuning element part 502R corresponding to the red pixel 414, the color tuning element part 502G corresponding to the green pixel 416, and the color tuning element part 502B corresponding to the blue pixel 418 have different thickness. Namely, the color tuning element has non-uniform thickness. It should be noted that the color tuning layer with non-uniform thickness can be formed by a photolithography or etching process, or other patterning processes. Further, the thickness of the color tuning element parts can be modified according to the relationship showing RGB peak intensity against thickness of the color tuning element as shown in FIG. 4, resulting in the maximum output of RGB emission to be increased. For example, the color tuning element part 502B corresponding to the blue pixel 418 can be thicker than the color tuning element part 502R corresponding to the red pixel 414, and the color tuning element part 502R corresponding to the red pixel 414 can be thicker than the color tuning element part 502G corresponding to the green pixel 416, in order to enhance the luminescence efficiency and optimize the chromaticity coordinate of the organic electroluminescent device. For example, the thickness $T_B$ of the color tuning element part 502B corresponding to the blue pixel 418 can be 19500 Å, the thickness $T_R$ of color tuning element part 502R corresponding to the red pixel 414 can be 7500 Å, and the thickness $T_G$ of the color tuning element part 502G corresponding to the green pixel 416 can be 4000 Å, corresponding to the equation: $T_B>T_R>T_G$. In other embodiments of the invention, the thickness of the color tuning layer parts 502B, 502R, and 502G can be modified according to the relationship shown in FIG. 4 to increase RGB peak intensity. Therefore, the relationship between the thickness of the color tuning layer parts 502B, 502R, and 502G can be represented by following equations: $T_R>T_B>T_G$, $T_B>T_G>T_R$, etc.

Figure 11:
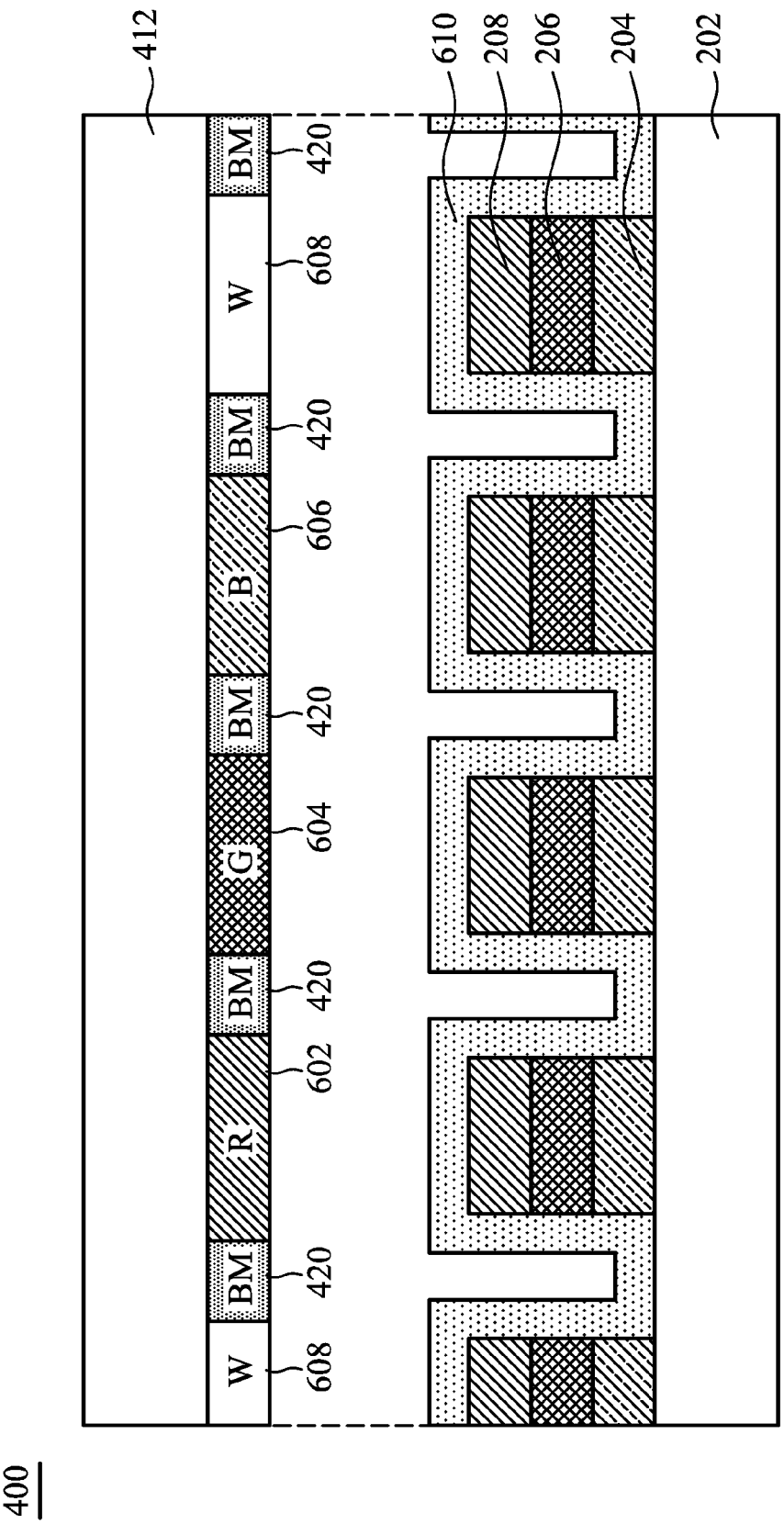
FIG. 11 is a cross-section of an organic electroluminescent device with a color filter substrate according to still another embodiment of the invention.

FIG. 11 shows a cross-section of an organic electroluminescent device 400 according to another embodiment of the invention. Herein, the color filter has a red pixel 602, a green pixel 604, a blue pixel 606, and a white pixel 608. Parts of the color tuning element 610 respectively corresponding to the red pixel 602, the green pixel 604, the blue pixel 606, and the white pixel 608 have the same thickness. Namely, the color tuning element 610 has a single thickness.

Figure 12:
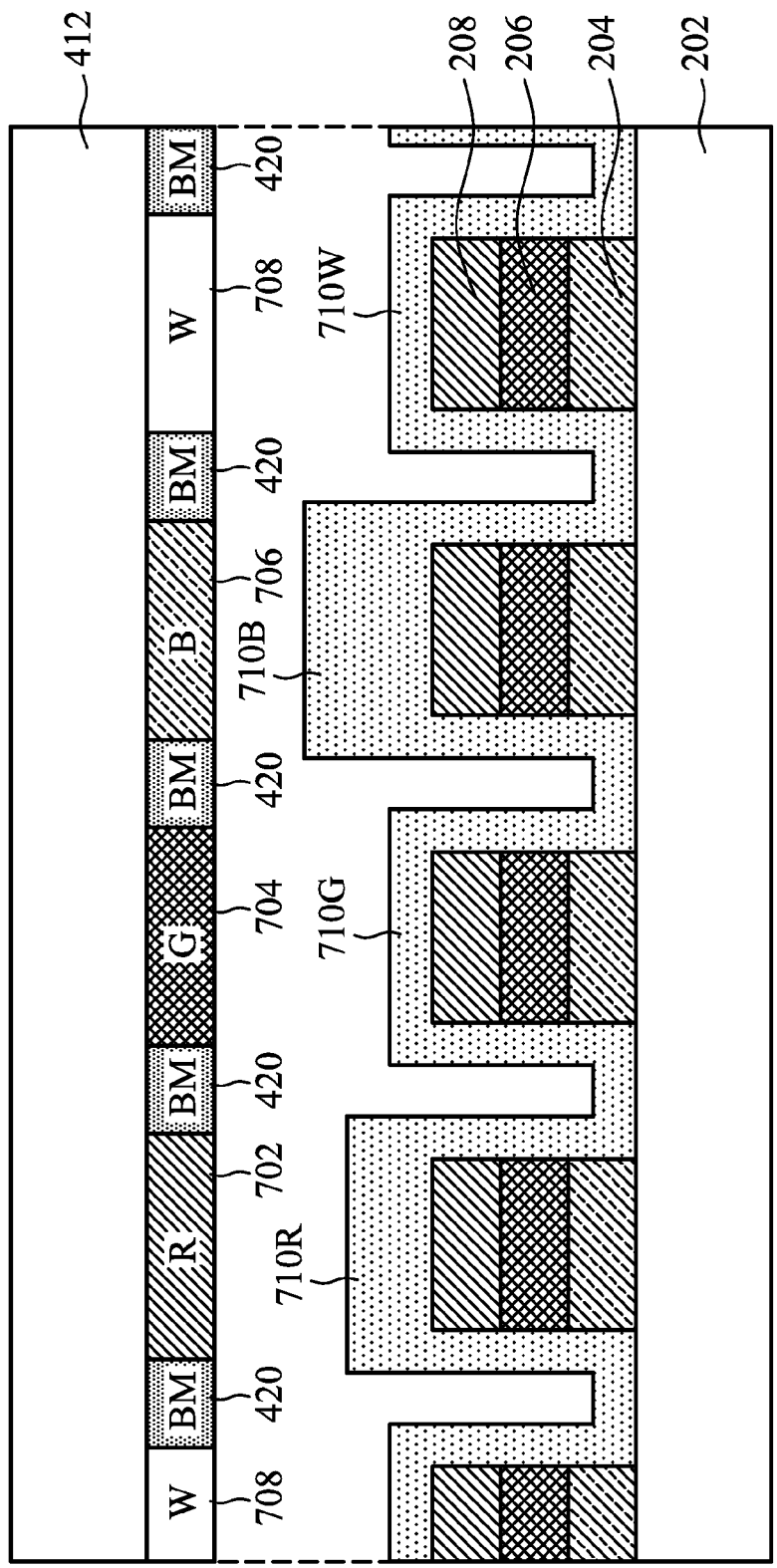
FIG. 12 is a cross-section of an organic electroluminescent device with a color filter substrate according to still another embodiment of the invention.

FIG. 12 shows a cross-section of an organic electroluminescent device 400 according to yet another embodiment of the invention. In comparison with FIG. 11, the color tuning element part 710R corresponding to the red pixel 702, the color tuning element part 710G corresponding to the green pixel 704, the color tuning element part 710B corresponding to the blue pixel 706, and the color tuning element part 710W corresponding to the white pixel 708 have different thickness. The color tuning element part 710B corresponding to the blue pixel 706 can be thicker than the color tuning element part 710R corresponding to the red pixel 702, the color tuning element part 710R corresponding to the red pixel 702 can be thicker than the color tuning element part 710G corresponding to the green pixel 704, and the color tuning element part 710G corresponding to the green pixel 704 can have the same thickness with the color tuning element part 710W corresponding to the white pixel 708. For example, the thickness of the color tuning element part 710B corresponding to the blue pixel 706 can be 19500 Å, the thickness of color tuning element part 710R corresponding to the red pixel 702 can be 7500 Å, and the thickness of the color tuning element part 710G corresponding to the green pixel 704 can be 4000 Å, and the color tuning element part 710W corresponding to the white pixel 708 can be 4000 Å. Further, the thickness of the color tuning element parts 710B, 710R, 710G, and 710W can be modified according to the relationship as shown in FIG. 4.

Figure 13:
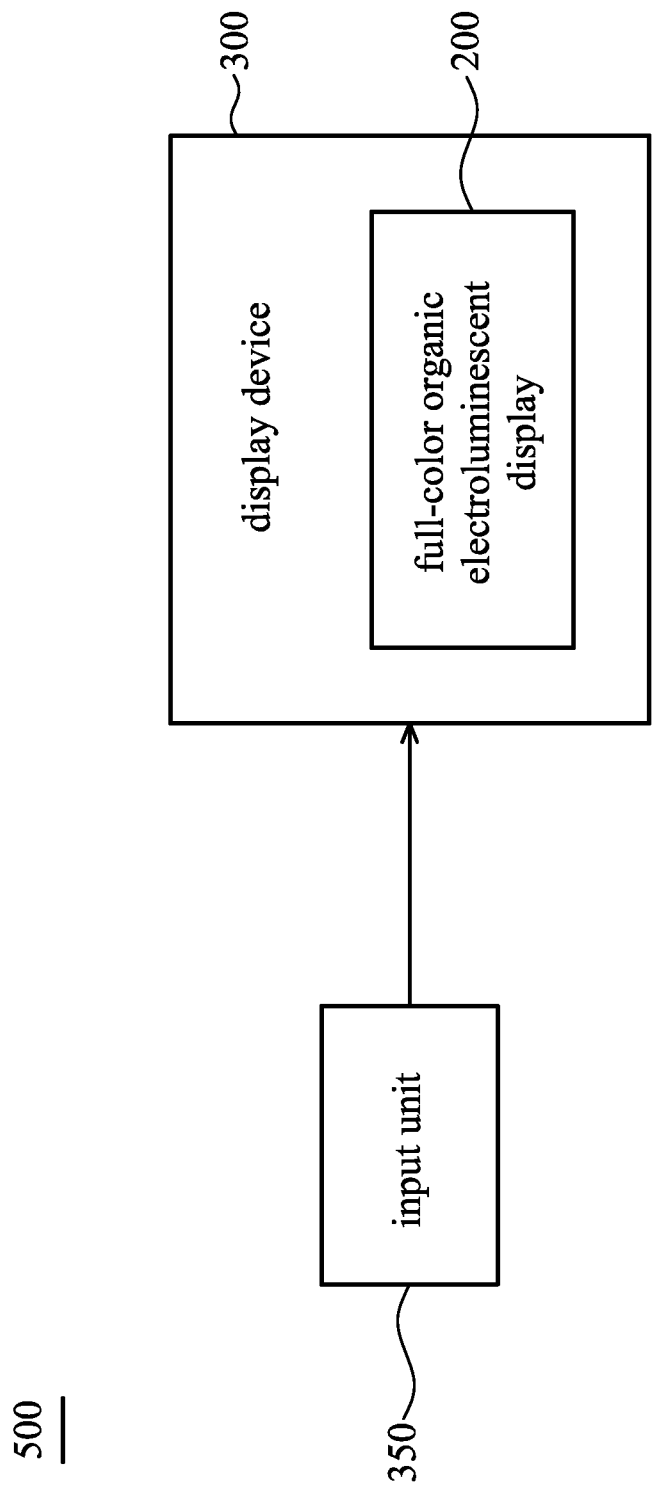
FIG. 13 schematically shows a block diagram of a system for displaying images according to an embodiment of the invention.

FIG. 13 schematically shows another embodiment of a system for displaying images which, in this case, is implemented as a display device 300 or an electronic device 500, such as a notebook computer, mobile phone, digital camera, PDA (personal data assistant), desktop computer, television, car display, or portable DVD player. The display device 300 comprises an electroluminescent device 200 or 400. In some embodiments, the display panel 300 can form a portion of a variety of electronic devices (in this case, electronic device 500). As shown in FIG. 13, the electronic device 500 can comprise the display device 300 and an input unit 350. Further, the input unit 350 is operatively coupled to the display panel 300 and provides input signals (e.g., an image signal) to the display panel 400 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
    an organic electroluminescent device, comprising:
       a substrate;
       a first electrode disposed on the substrate;
       an organic electroluminescent element disposed on the first electrode;
       a second electrode disposed on the organic electroluminescent element; and
       a first color tuning element disposed on the second electrode, the organic electroluminescent element is between the first color tuning element and the substrate, wherein the color tuning element has a thickness T1: 9500 Å≤T1≤10500 Å, 11000 Å≤T1≤12000 Å, 13500 Å≤T1≤14500 Å, 16500 Å≤T1≤17500 Å, or 18500 Å≤T1≤19500 Å.

2. The system as claimed in claim 1, wherein the first color tuning element comprises a first color tuning layer, and the first color tuning layer is made of a material with a refractive index of between 1.6-2.2.

3. The system as claimed in claim 2, wherein the first color tuning element further comprises a second color tuning layer disposed between the first color tuning layer and the second electrode, wherein the second color tuning layer is made of a material with a refractive Index of between 1.4-1.6.

4. The system as claimed in claim 3, wherein the first color tuning element further comprises a third color tuning layer disposed on the first color tuning layer, wherein the third color tuning layer is made of a material with a refractive index of between 1.5-2.0.

5. The system as claimed in claim 1, wherein the organic electroluminescent device further comprises:
    a stress relief layer disposed on the first color tuning element; and
    a second color tuning element disposed on the stress relief layer, wherein the second color tuning element has a thickness range T2: 3500 Å≤T2≤4500 Å, 6500 Å≤T2≤7500 Å, 9500 Å≤T2≤10500 Å, 11000 Å≤T2≤12000 Å, 13500 Å≤T2≤14500 Å, 16500 Å≤T2≤17500 Å, or 18500 Å≤T2≤19500 Å.

6. The system as claimed in claim 5, wherein the stress relief layer comprises indium tin oxide, indium zinc oxide, aluminum zinc oxide, zincoxide, aluminium oxide, or combinations thereof.

7. The system as claimed in claim 5, wherein the stress relief layer has a refractive index of between 1.4-2.2.

8. The system as claimed in claim 5, wherein the first color tuning element comprises a first color tuning layer, and the first color tuning layer is made of a material with a refractive index of between 1.4-2.2.

9. The system as claimed in claim 8, wherein the first color tuning layer comprises silicon oxide, silicon nitride, silicon oxynitride, or combinations thereof.

10. The system as claimed in claim 8, wherein the second color tuning element comprises a second color tuning layer, and the second color tuning layer is made of a material with a refractive index of between 1.4-2.2.

11. The system as claimed in claim 10, wherein the second color tuning element further comprises a third color tuning layer disposed above or below the second color tuning layer, and the third color tuning layer is made of a material with a refractive index of between 1.4-1.6.

12. The system as claimed in claim 10, wherein the second color tuning element further comprises a third color tuning layer disposed above or below the second color tuning layer, and the third color tuning layer is made of a material with a refractive index of between 1.5-2.0.

13. The system as claimed in claim 5, wherein the stress relationship of the first color tuning element, the stress relief layer, and the second color tuning element is represented in sequence as compressive/tensile/compressive or tensile/compressive/tensile.

14. The system as claimed in claim 5, wherein the refractive index difference between any two of the first color tuning element, the stress relief layer, and the second color tuning element is not more than 1.

15. The system as claimed in claim 1, further comprising:
    a color filter substrate disposed on the organic electroluminescent device, wherein the color filter substrate comprises a red pixel, a green pixel, and a blue pixel.

16. The system as claimed in claim 15, wherein parts of the first color tuning element respectively corresponding to the red pixel, the green pixel, and the blue pixel have different thickness.

17. The system as claimed in claim 15, wherein parts of the first color tuning layer respectively corresponding to the red pixel, the green pixel, and the blue pixel have the same thickness.

18. The system as claimed in claim 15, wherein the color filter substrate further comprises a white pixel, and parts of the first color tuning layer respectively corresponding to the red pixel, the green pixel, the blue pixel, and the white pixel have different thickness.

19. The system as claimed in claim 1, further comprising:
    a display device comprising the organic electroluminescent device.

20. The system as claimed in claim 19, further comprising:
    an electronic device, wherein the electronic device comprises the display device, and an input unit is coupled to the display device to provide input to the display device such that the display device displays images.

* * * * *